US012610804B2

(12) United States Patent
Tsai

(10) Patent No.: US 12,610,804 B2
(45) Date of Patent: Apr. 21, 2026

(54) CONTACT STRUCTURE, SEMICONDUCTOR DEVICE COMPRISING THE SAME, AND METHOD FOR FABRICATING THE SAME

(71) Applicant: NANYA TECHNOLOGY CORPORATION, New Taipei City (TW)

(72) Inventor: Jhen-Yu Tsai, Kaohsiung City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 414 days.

(21) Appl. No.: 18/515,717

(22) Filed: Nov. 21, 2023

(65) Prior Publication Data

US 2025/0112159 A1 Apr. 3, 2025

Related U.S. Application Data

(62) Division of application No. 18/376,059, filed on Oct. 3, 2023.

(51) Int. Cl.
*H10W 20/20* (2026.01)
*H10W 20/00* (2026.01)
*H10W 20/41* (2026.01)

(52) U.S. Cl.
CPC ......... *H10W 20/20* (2026.01); *H10W 20/056* (2026.01); *H10W 20/083* (2026.01); *H10W 20/435* (2026.01)

(58) Field of Classification Search
CPC .................................................. H10W 20/20
See application file for complete search history.

(56) References Cited

U.S. PATENT DOCUMENTS

| | | | | |
|---|---|---|---|---|
| 7,872,301 | B2 * | 1/2011 | Takaishi | H10D 62/117 |
| | | | | 257/E21.294 |
| 10,886,406 | B1 * | 1/2021 | Lin | H10B 12/053 |
| 11,114,441 | B1 * | 9/2021 | Lin | H10B 12/315 |
| 11,521,976 | B1 * | 12/2022 | Tsai | H10B 12/315 |
| 2004/0000717 | A1 * | 1/2004 | Shin | H10B 12/09 |
| | | | | 257/E21.585 |

(Continued)

FOREIGN PATENT DOCUMENTS

| | | |
|---|---|---|
| TW | 201029110 A | 8/2010 |
| TW | 201833974 A | 9/2018 |

(Continued)

OTHER PUBLICATIONS

Office Action and research report dated on Oct. 7, 2024 related to Taiwanese Application No. 113117337.

(Continued)

*Primary Examiner* — Dale E Page
*Assistant Examiner* — Rohit Parthasarathy
(74) *Attorney, Agent, or Firm* — Xuan Zhang

(57) ABSTRACT

The present application discloses a contact structure, a semiconductor device including the contact structure, and a method for fabricating the semiconductor device. The contact structure includes a body portion; and an extending portion downwardly extending from the body portion and including a groove. The groove is recessed from a bottom surface of the extending portion, leading towards the body portion, and exposing the body portion.

10 Claims, 30 Drawing Sheets

10

Providing a substrate, forming a plurality of word line structures in the substrate, forming a bottom dielectric layer on the substrate, forming a bit-line contact on the substrate, sequentially forming a middle dielectric layer and a top dielectric layer on the bottom dielectric layer, forming a bit line on the bit-line contact, and forming a plurality of cell-contact openings along the top dielectric layer, the middle dielectric layer, and the bottom dielectric layer to expose the substrate — S11

Sequentially forming a first sacrificial layer and a second sacrificial layer to partially fill the plurality of cell-contact openings, forming a plurality of first intermediate openings and a plurality of second intermediate openings which expose the impurity region — S13

Forming a plurality of blocking layers in the plurality of the second intermediate openings, removing the second sacrificial layer, deepening the plurality of cell-contact openings to form a plurality of extended cell-contact openings, removing the plurality of blocking layers, and forming a plurality of contact structures in the plurality of extended cell-contact openings — S15

(56)                    References Cited

U.S. PATENT DOCUMENTS

| | | | | |
|---|---|---|---|---|
| 2005/0098824 A1* | 5/2005 | Chen | H10W 20/069 | 438/257 |
| 2005/0158972 A1* | 7/2005 | Lin | H10W 20/069 | 257/E21.507 |
| 2007/0264788 A1* | 11/2007 | Lee | H10D 64/027 | 257/E21.429 |
| 2009/0298247 A1* | 12/2009 | Kim | H10D 64/015 | 257/E21.409 |
| 2010/0001327 A1* | 1/2010 | Kim | H10D 84/016 | 257/E29.345 |
| 2016/0079363 A1* | 3/2016 | Lee | G06F 3/0679 | 257/330 |
| 2020/0098780 A1* | 3/2020 | Cui | H10B 43/10 | |
| 2020/0144273 A1* | 5/2020 | Huang | H10B 12/485 | |
| 2020/0411527 A1* | 12/2020 | Yang | H10B 12/36 | |
| 2021/0249350 A1* | 8/2021 | Shen | H10D 1/692 | |
| 2021/0265358 A1* | 8/2021 | Tsai | H10B 12/05 | |
| 2021/0265380 A1* | 8/2021 | Obu | H10B 43/27 | |
| 2022/0068924 A1* | 3/2022 | Tsai | H10B 12/33 | |
| 2022/0077155 A1* | 3/2022 | Huang | H10B 12/053 | |
| 2022/0085024 A1* | 3/2022 | Li | H10B 12/033 | |
| 2022/0122982 A1* | 4/2022 | Shih | H10B 12/315 | |
| 2022/0139790 A1* | 5/2022 | Yang | H10P 74/273 | 257/48 |
| 2022/0285361 A1* | 9/2022 | Yu | H10B 12/0335 | |
| 2022/0320108 A1* | 10/2022 | Lu | H10B 12/482 | |
| 2022/0399446 A1* | 12/2022 | Huang | H10D 64/01 | |
| 2023/0029832 A1* | 2/2023 | Wang | H10D 1/68 | |
| 2023/0099828 A1* | 3/2023 | Ai | H10B 12/0335 | 257/296 |
| 2023/0209807 A1* | 6/2023 | Wu | H10B 12/488 | 257/295 |
| 2023/0309298 A1* | 9/2023 | Ohsawa | H10B 43/27 | |
| 2023/0328963 A1* | 10/2023 | Kim | H10B 12/315 | |
| 2025/0120070 A1* | 4/2025 | Tsai | H10B 12/0387 | |

FOREIGN PATENT DOCUMENTS

| | | |
|---|---|---|
| TW | 201843772 A | 12/2018 |
| TW | 202137514 A | 10/2021 |
| TW | 202145585 A | 12/2021 |
| TW | 202303844 A | 1/2023 |
| TW | 202316490 A | 4/2023 |
| TW | 202331940 A | 8/2023 |
| TW | 202339260 A | 10/2023 |

OTHER PUBLICATIONS

Office Action and research report dated on Oct. 8, 2024 related to Taiwanese Application No. 112149347.

* cited by examiner

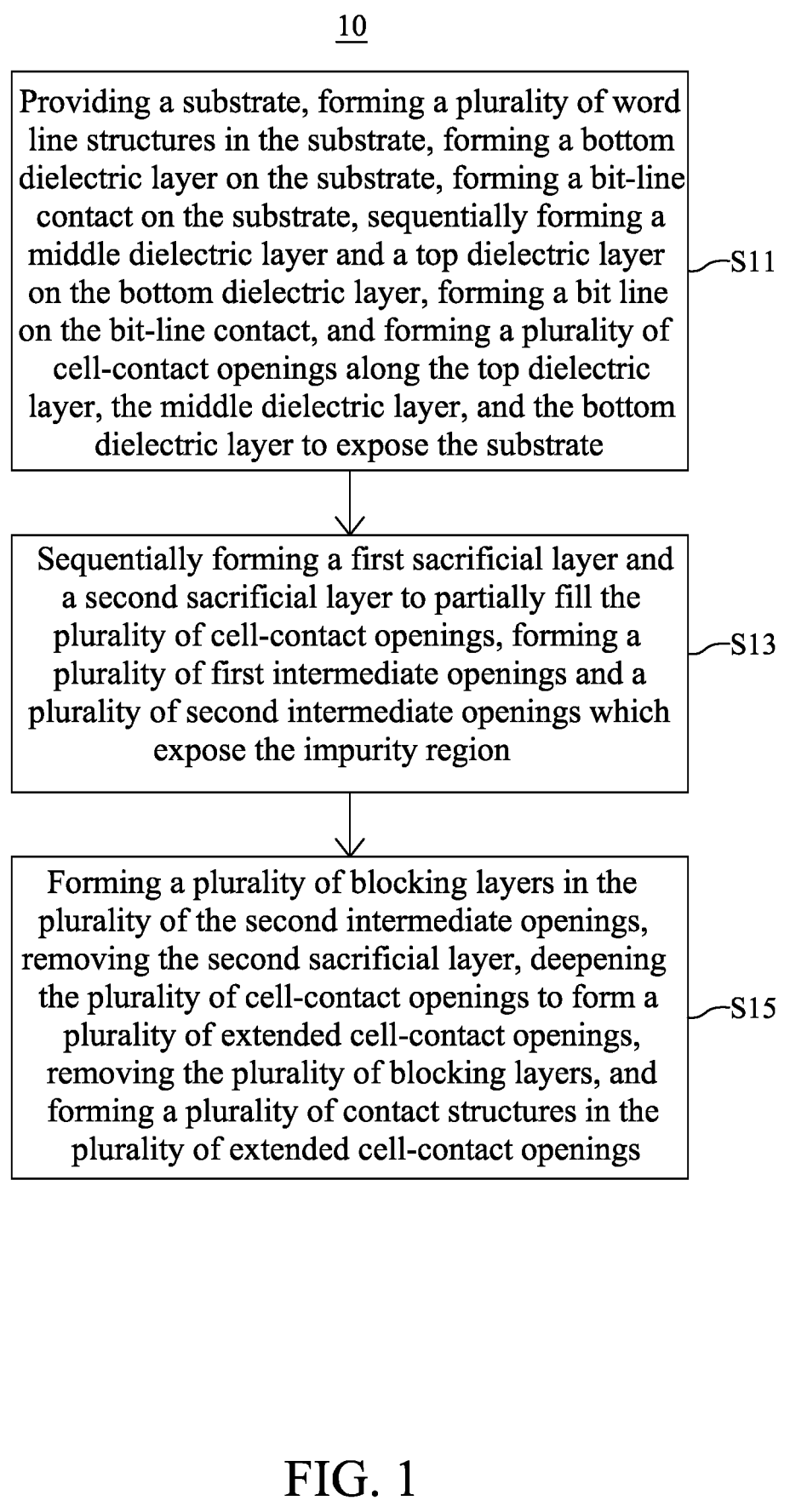

10

Providing a substrate, forming a plurality of word line structures in the substrate, forming a bottom dielectric layer on the substrate, forming a bit-line contact on the substrate, sequentially forming a middle dielectric layer and a top dielectric layer on the bottom dielectric layer, forming a bit line on the bit-line contact, and forming a plurality of cell-contact openings along the top dielectric layer, the middle dielectric layer, and the bottom dielectric layer to expose the substrate ⌐S11

Sequentially forming a first sacrificial layer and a second sacrificial layer to partially fill the plurality of cell-contact openings, forming a plurality of first intermediate openings and a plurality of second intermediate openings which expose the impurity region ⌐S13

Forming a plurality of blocking layers in the plurality of the second intermediate openings, removing the second sacrificial layer, deepening the plurality of cell-contact openings to form a plurality of extended cell-contact openings, removing the plurality of blocking layers, and forming a plurality of contact structures in the plurality of extended cell-contact openings ⌐S15

FIG. 1

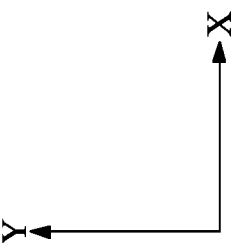
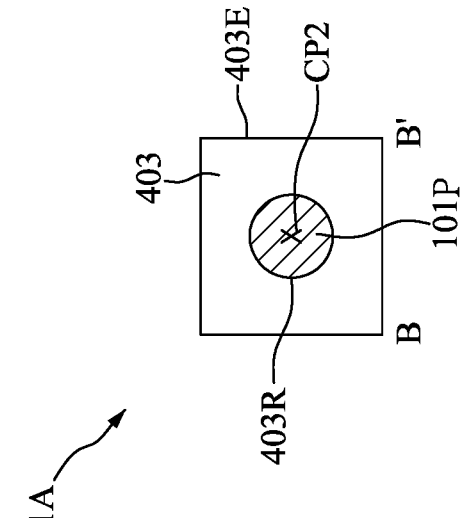
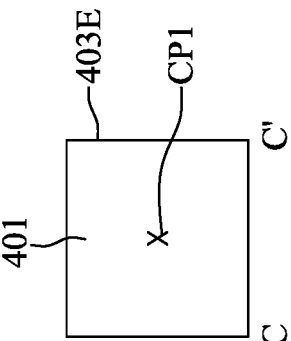
FIG. 27

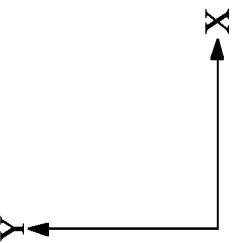
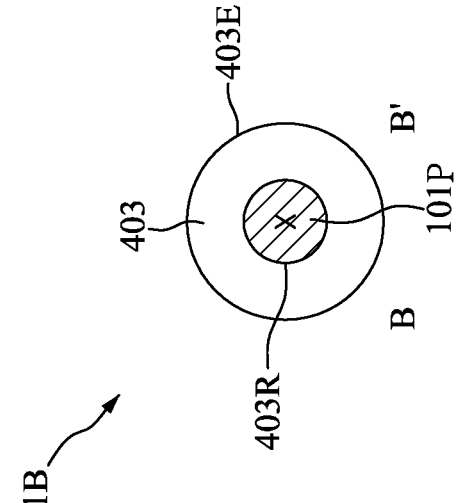
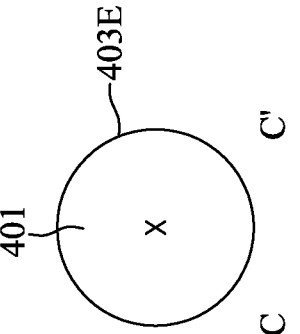
FIG. 28

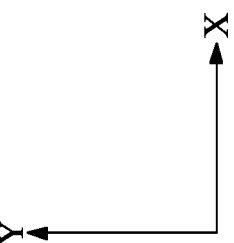
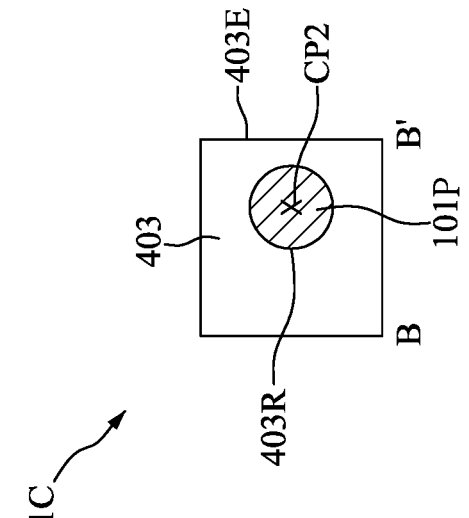
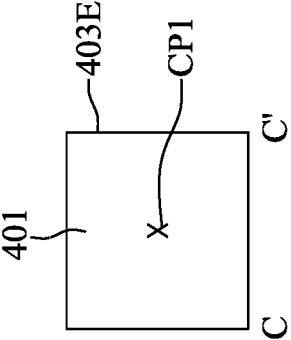
FIG. 29

CONTACT STRUCTURE, SEMICONDUCTOR DEVICE COMPRISING THE SAME, AND METHOD FOR FABRICATING THE SAME

CROSS-REFERENCE TO RELATED APPLICATION

This application is a divisional application of U.S. Non-Provisional application Ser. No. 18/376,059 filed Oct. 3, 2023, which is incorporated herein by reference in its entirety.

TECHNICAL FIELD

The present disclosure relates to a contact structure, a semiconductor device with a contact structure, and a method for fabricating the semiconductor device, and more particularly, to a contact structure with an extending portion.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a contact structure including a body portion; and an extending portion downwardly extending from the body portion and comprising a groove. The groove is recessed from a bottom surface of the extending portion, leading towards the body portion, and exposing the body portion.

Another aspect of the present disclosure provides a semiconductor device including a substrate; an impurity region positioned in the substrate; and a contact structure comprising a body portion positioned on the substrate, and an extending portion downwardly extending from the body portion towards the substrate and resulting in a groove. The groove accommodates a protruding portion of the impurity region, which directly contacts the body portion.

Another aspect of the present disclosure provides a method for fabricating a semiconductor device including providing a substrate; forming a dielectric layer on the substrate; forming a cell-contact opening along the dielectric layer to expose the substrate; conformally forming a sacrificial layer that partially fills the cell-contact opening, resulting in an intermediate opening that exposes the substrate; forming a blocking layer completely filling the intermediate opening; removing the sacrificial layer; performing an etching process using the blocking layer as a mask to deepen the cell-contact opening into the substrate and turn the cell-contact opening into an extended cell-contact opening, which surrounds a protruding portion of the substrate; removing the blocking layer; and forming a contact structure in the extended cell-contact opening.

Due to the design of the semiconductor device of the present disclosure, the extending portion may increase the contact area of the contact structure. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure;

US 12,610,804 B2

3

Figure 22:
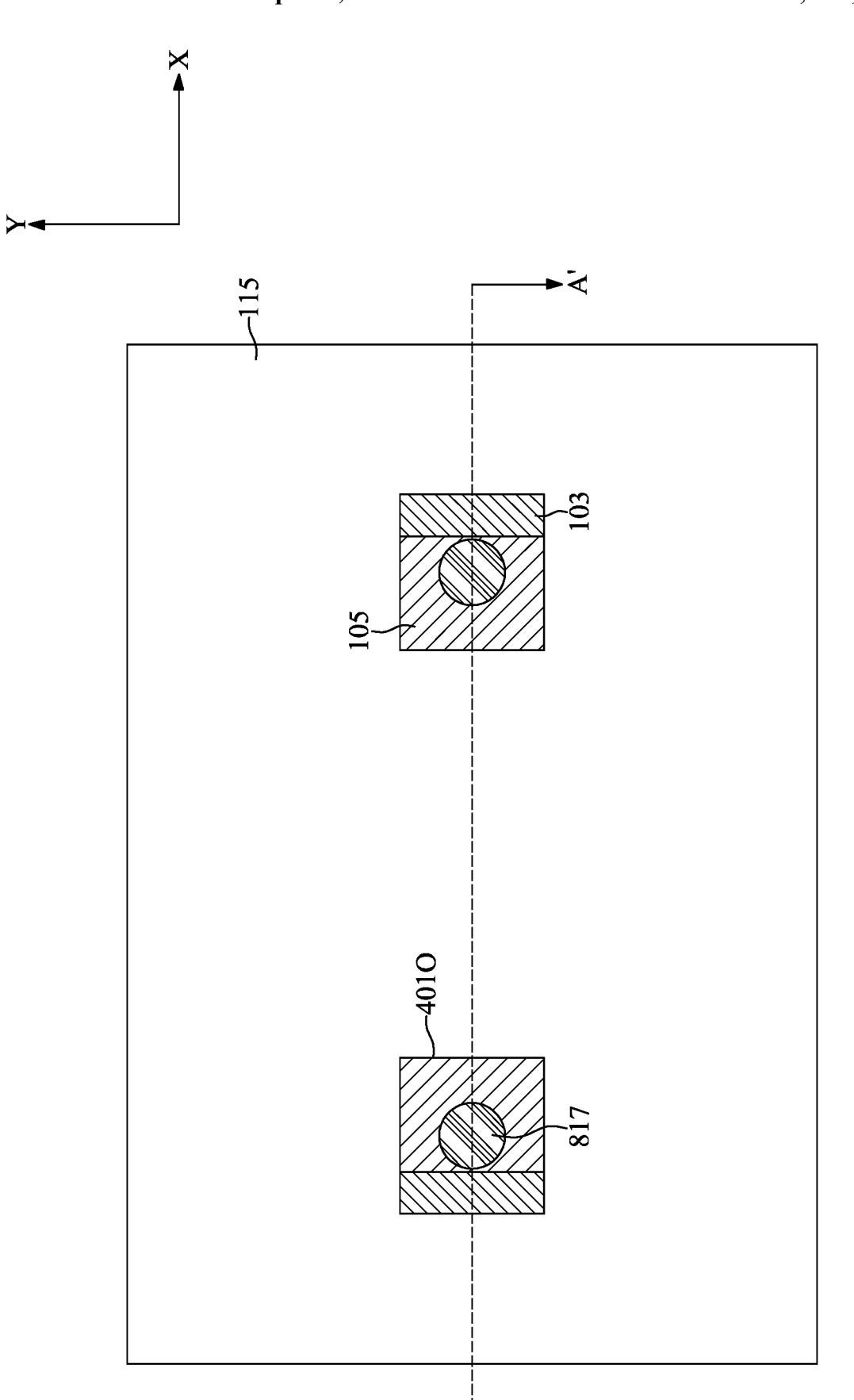
Figure 26:
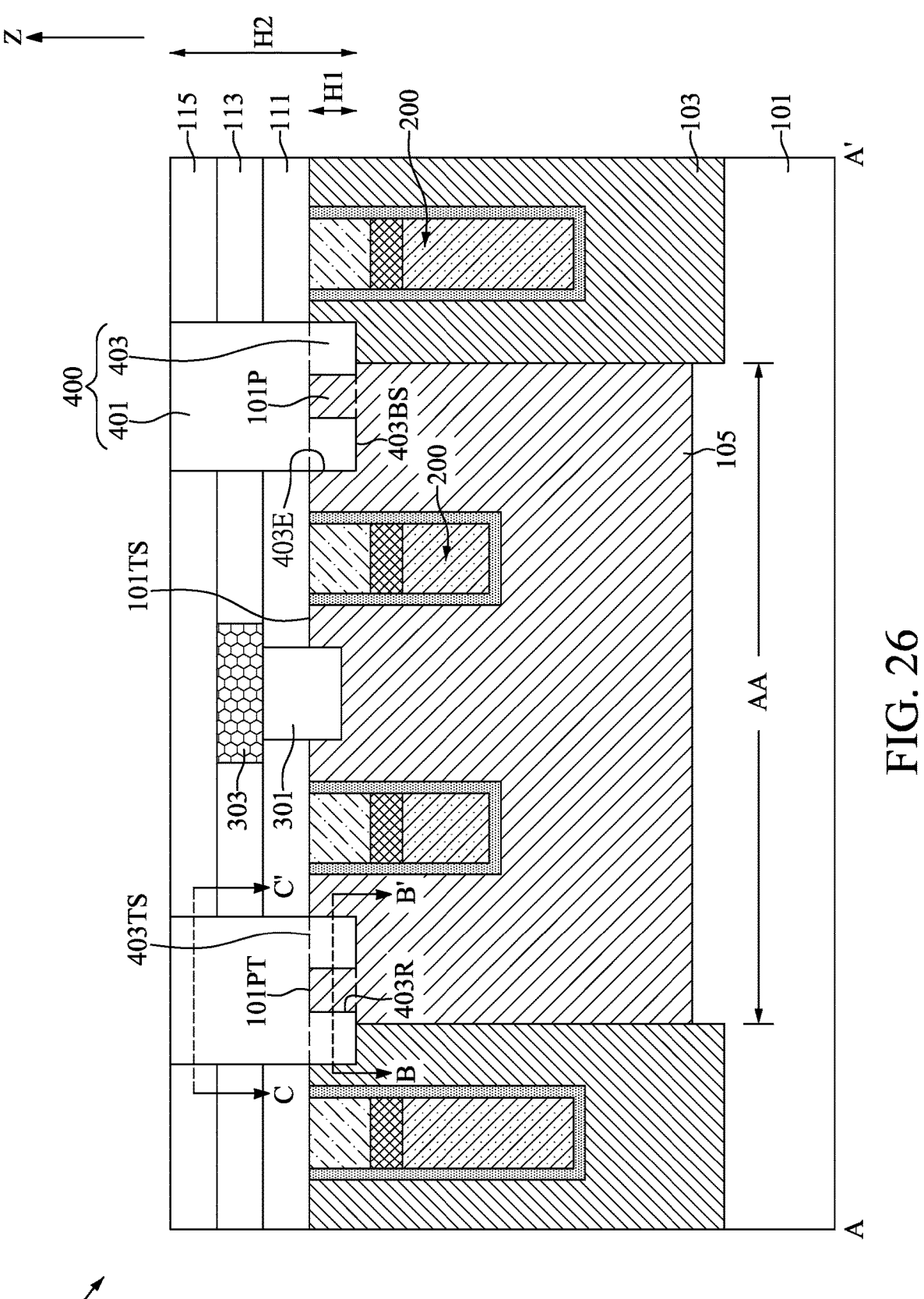
Figure 30:

FIG. 22 illustrates, in a schematic top-view diagram, an intermediate semiconductor device in accordance with one embodiment of the present disclosure;

FIGS. 23 to 26 are schematic cross-sectional view diagrams taken along a line A-A' in FIG. 22 illustrating part of the flow for fabricating the semiconductor device in accordance with one embodiment of the present disclosure;

FIG. 27 is a schematic cross-sectional view diagram taken along lines A-A' and B-B' in FIG. 26;

FIGS. 28 and 29 illustrate, in schematic cross-sectional view diagrams, body portions and extending portions of semiconductor devices in accordance with some embodiments of the present disclosure; and FIG. 30 illustrates, in a schematic cross-sectional view diagram, a semiconductor device in accordance with another embodiment of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 11:
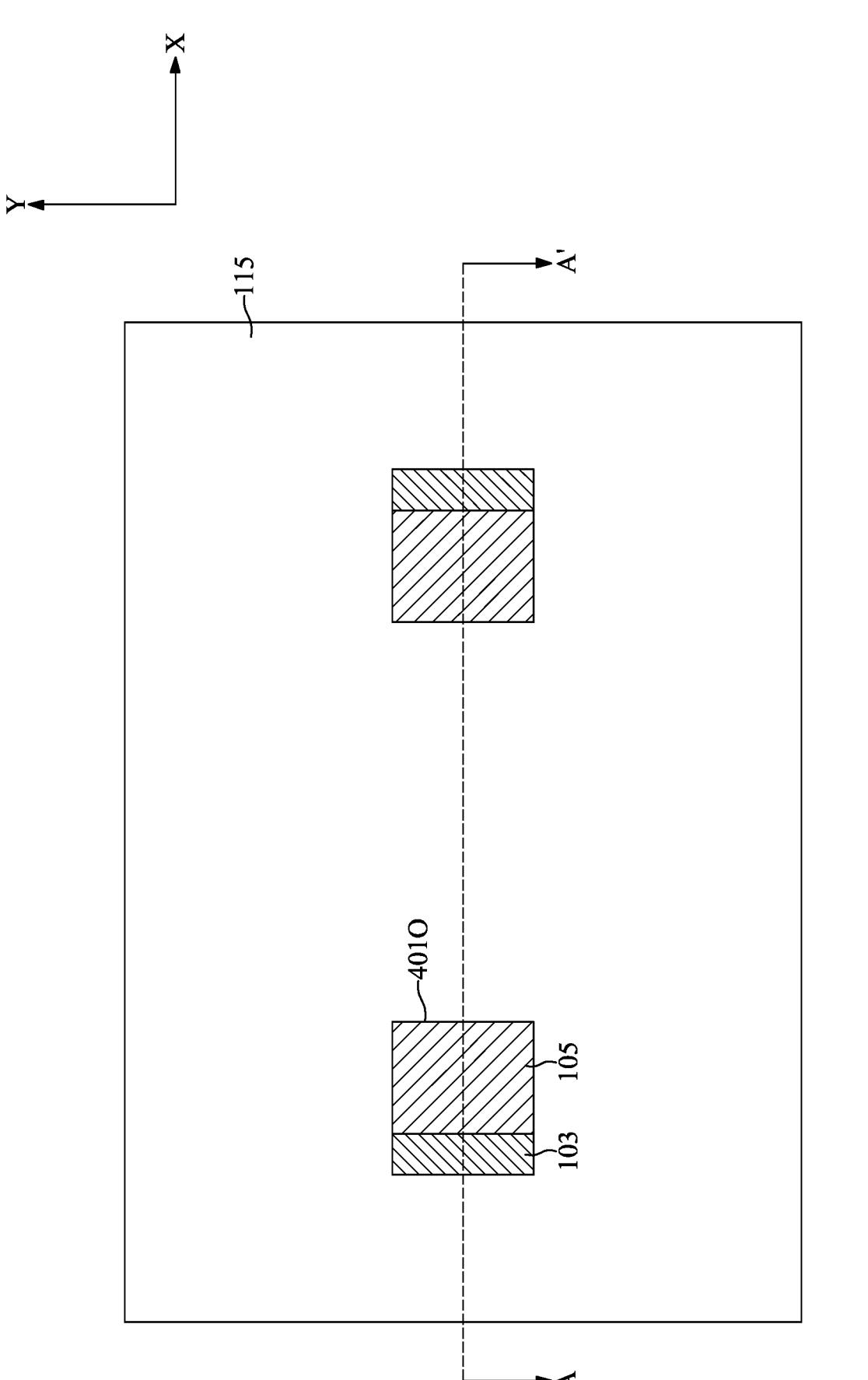
FIG. 11 illustrates, in a schematic top-view diagram, an intermediate semiconductor device in accordance with one embodiment of the present disclosure.
Figure 12:
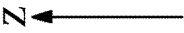
FIG. 12 is a schematic cross-sectional view diagram taken along a line A-A' in FIG. 11.

FIG. 1 illustrates, in a flowchart diagram form, a method 10 for fabricating a semiconductor device 1A in accordance with one embodiment of the present disclosure. FIGS. 2 to 10 illustrate, in schematic cross-sectional view diagrams, part of a flow for fabricating the semiconductor device 1A in accordance with one embodiment of the present disclosure. FIG. 11 illustrates, in a schematic top-view diagram, an intermediate semiconductor device in accordance with one embodiment of the present disclosure. FIG. 12 is a schematic cross-sectional view diagram taken along a line A-A' in FIG. 11.

With reference to FIGS. 1 to 10, at step S11, a substrate 101 may be provided, a plurality of word line structures 200 may be formed in the substrate 101, a bottom dielectric layer 111 may be formed on the substrate 101, a bit-line contact 301 may be formed on the substrate 101, a middle dielectric layer 113 and a top dielectric layer 115 may be sequentially formed on the bottom dielectric layer 111, a bit line 303 may be formed on the bit-line contact 301, and a plurality of cell-contact openings 401O may be formed along the top dielectric layer 115, the middle dielectric layer 113, and the bottom dielectric layer 111 to expose the substrate 101.

Figure 2:
FIGS. 2 to 10 illustrate, in schematic cross-sectional view diagrams, part of a flow for fabricating the semiconductor device in accordance with one embodiment of the present disclosure.

With reference to FIG. 2, the substrate 101 may include a bulk semiconductor substrate. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

With reference to FIG. 2, an isolation layer 103 may be formed in the substrate 101. A series of deposition processes may be performed to deposit a pad oxide layer (not shown) and a pad nitride layer (not shown) on the substrate 101. A photolithography process and a subsequent etching process, such as an anisotropic dry etching process, may be performed to form trenches penetrating through the pad oxide layer, the pad nitride layer, and extending to the substrate 101. An insulating material may be deposited into the trenches and a planarization process, such as chemical mechanical polishing, may be subsequently performed until the top surface 101TS of the substrate 101 is exposed to remove excess filling material, provide a substantially flat surface for subsequent processing steps, and concurrently form the isolation layer 103. The insulating material may be, for example, silicon oxide or other applicable insulating materials. In some embodiments, the isolation layer 103 may define an active area AA in the substrate 101.

With reference to FIG. 2, an impurity region 105 may be formed in the active area AA. In some embodiments, the impurity region 105 may be formed by an implantation process using p-type dopants or n-type dopants. The impurity region 105 may serve as source and drain for the semiconductor device 1A.

The term "p-type dopant" refers to an impurity that when added to an intrinsic semiconductor material creates deficiencies of valence electrons. In a silicon containing semiconductor material, examples of p-type dopants include, but are not limited to, boron, aluminum, gallium, or indium. The term "n-type dopant" refers to an impurity that when added to an intrinsic semiconductor material contributes free electrons to the intrinsic semiconductor material. In a silicon-containing material, examples of n-type dopants include, but are not limited to, antimony, arsenic, or phosphorus.

With reference to FIG. 2, a first mask layer 811 may be formed on the substrate 101. In some embodiments, the first mask layer 811 may be a photoresist layer and may include the pattern of the plurality of word line structures 200.

Figure 3:

With reference to FIG. 3, a trench etching process may be performed using the first mask layer 811 as a mask to remove portions of the isolation layer 103 and portions of the substrate 101, and concurrently form a plurality of trenches TR1, TR2. In some embodiments, the plurality of trenches TR1 formed in the substrate 101 may be shallower than the plurality of trenches TR2 formed in the isolation layer 103. After formation of the plurality of trenches TR1, TR2, the first mask layer 811 may be removed.

Figure 4:

With reference to FIG. 4, a layer of first insulating material 611 may be conformally formed on the substrate 101, on the isolation layer 103, and in the plurality of trenches TR1, TR2. The layer of first insulating material 611 may have a U-shaped cross-sectional profile in the plurality of trenches TR1, TR2. In some embodiments, the layer of first insulating material 611 may have a thickness in a range of about 1 nm to about 7 nm, including about 1 nm, about 2 nm, about 3 nm, about 4 nm, about 5 nm, about 6 nm, or about 7 nm.

In some embodiments, the layer of first insulating material 611 may be formed by a thermal oxidation process. For example, the layer of first insulating material 611 may be formed by oxidizing the surface of the plurality of trenches TR1, TR2. In some embodiments, the layer of first insulating material 611 may be formed by a deposition process such as a chemical vapor deposition or an atomic layer deposition. The first insulating material 611 may include a high-k material, an oxide, a nitride, an oxynitride or combinations thereof. In some embodiments, after a liner polysilicon layer (not shown for clarity) is deposited, the layer of first insulating material 611 may be formed by radical oxidizing the liner polysilicon layer. In some embodiments, after a liner silicon nitride layer (not shown for clarity) is formed, the layer of first insulating material 611 may be formed by radical oxidizing the liner silicon nitride layer.

In some embodiments, the high-k dielectric material may include a hafnium-containing material. The hafnium-containing material may be, for example, hafnium oxide, hafnium silicon oxide, hafnium silicon oxynitride, or a combination thereof. In some embodiments, the high-k dielectric material may be, for example, lanthanum oxide, lanthanum aluminum oxide, zirconium oxide, zirconium silicon oxide, zirconium silicon oxynitride, aluminum oxide or a combination thereof.

With reference to FIG. 4, a plurality of word line bottom conductive layers 203 may be formed in the plurality of trenches TR1, TR2, respectively and correspondingly. For example, a conductive material (not shown) may be formed to fill the plurality of trenches TR1, TR2. An etching back process may be subsequently performed to partially remove the conductive material formed in the plurality of trenches TR1, TR2 and concurrently form the plurality of word line bottom conductive layers 203. In some embodiments, the conductive material may be a work function material such as, titanium, titanium nitride, silicon, silicon germanium, or a combination thereof. It should be noted that the term "work function" refers to the bulk chemical potential of a material (e.g., metal) relative to the vacuum level. For example, in the present embodiment, the conductive material is titanium nitride and may be formed by chemical vapor deposition.

With reference to FIG. 4, a plurality of word line top conductive layers 205 may be formed in the plurality of trenches TR1, TR2. In some embodiments, the plurality of word line top conductive layers 205 may be formed of, for example, polycrystalline silicon, polycrystalline germanium, polycrystalline silicon germanium, doped polycrystalline silicon, doped polycrystalline germanium, doped polycrystalline silicon germanium, or a combination thereof. In some embodiments, the plurality of word line top conductive layers 205 may be doped with p-type dopants or n-type dopants. In some embodiments, a conductive material such as polycrystalline silicon, polycrystalline germanium, or polycrystalline silicon germanium may be deposited into the plurality of trenches TR1, TR2. An etching back process may be subsequently performed to remove portions of the conductive to form the plurality of word line top conductive layers 205. In some embodiments, the dopants may be incorporated into the deposition process of the conductive material. In some embodiments, the dopants may be doped using an implantation process after the etching back process.

With reference to FIG. 4, a word line capping layer 207 may be formed to completely fill the plurality of trenches TR1, TR2. In some embodiments, the word line capping layer 207 may be formed of, for example, silicon nitride, silicon oxynitride, silicon nitride oxide, or other applicable dielectric material. In some embodiments, the word line capping layer 207 may be formed by, for example, chemical vapor deposition, plasma-enhanced chemical vapor deposition, or other applicable deposition processes.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 5:
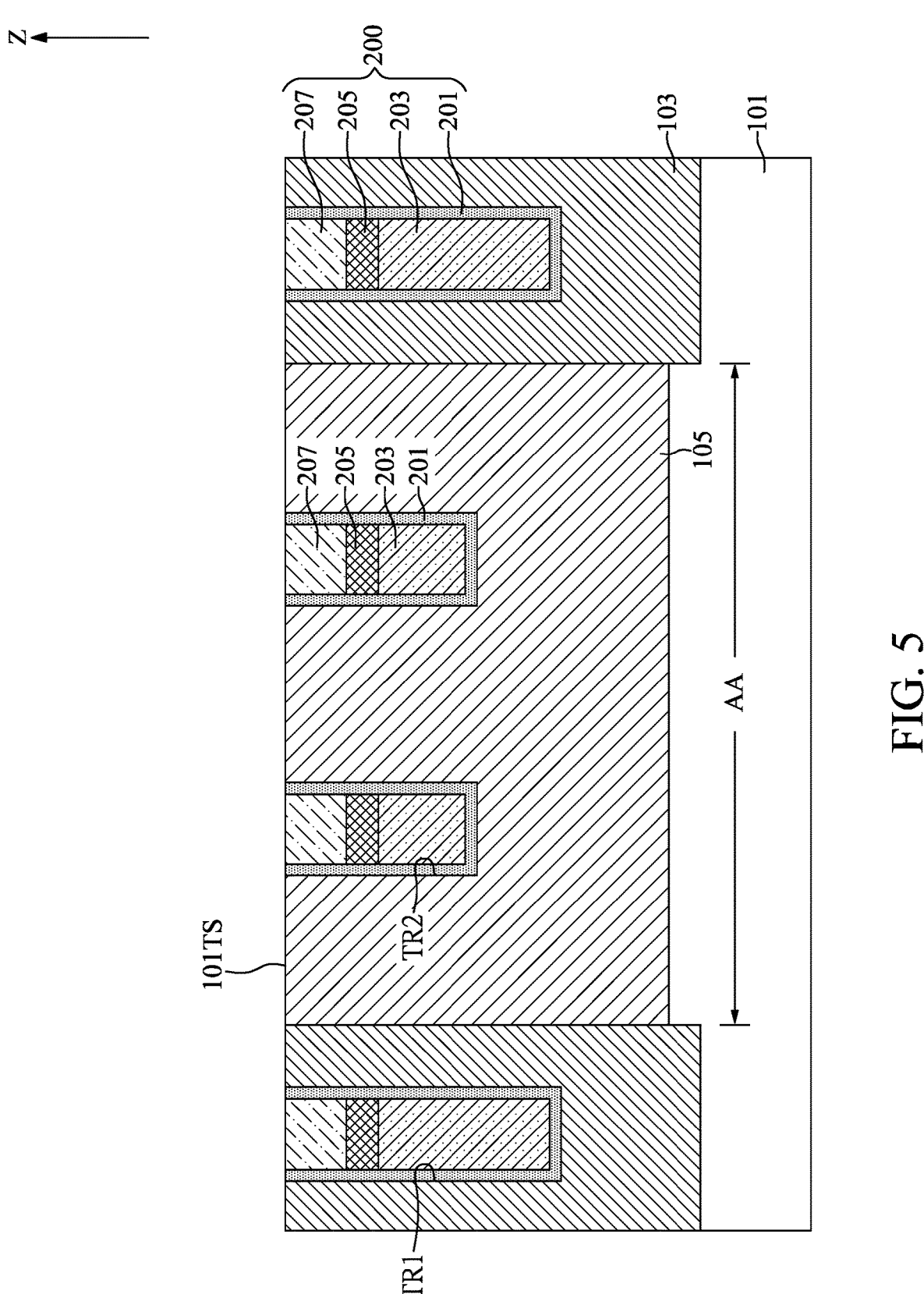

With reference to FIG. 5, a planarization process, such as chemical mechanical polishing, may be performed until the top surface 101TS of the substrate 101 is exposed to remove excess material and provide a substantially flat surface for subsequent processing steps. After the planarization process, the layer of first insulating material 611 may be turned into a plurality of word line dielectric layers 201 in the plurality of trenches TR1, TR2, respectively and correspondingly. The word line capping layer 207 may be turned into multiple segments and may be formed on the plurality of word line top conductive layers 205, respectively and correspondingly. The plurality of word line dielectric layers 201, the plurality of word line bottom conductive layers 203, the plurality of word line top conductive layers 205, and the plurality of word line capping layers 207 together configure the plurality of word line structures 200. It should be noted that while the word line structure 200 in trench TR1 and the word line structure 200 in trench TR2 differ in dimensions, their layer compositions remain the same.

Figure 6:
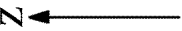

With reference to FIG. 6, the bottom dielectric layer 111 may be formed on the substrate 101. In some embodiments, the bottom dielectric layer 111 may be formed of, for example, silicon oxide, undoped silicate glass, fluorosilicate glass, borophosphosilicate glass, a spin-on low-k dielectric layer, a chemical vapor deposition low-k dielectric layer, or a combination thereof. The term "low-k" as used throughout the present disclosure denotes a dielectric material that has a dielectric constant of less than silicon oxide. In some embodiments, the bottom dielectric layer 111 may include a self-planarizing material such as a spin-on glass or a spin-on low-k dielectric material such as SiLK™. The use of a self-planarizing dielectric material may avoid the need to perform a subsequent planarizing step. In some embodiments, the bottom dielectric layer 111 may be formed by a deposition process including, for example, chemical vapor deposition, plasma-enhanced chemical vapor deposition, evaporation, or spin-on coating.

With reference to FIG. 6, a second mask layer 813 may be formed on the bottom dielectric layer 111. In some embodiments, the second mask layer 813 may be a photoresist layer and may include the pattern of the bit-line contact 301.

Figure 7:
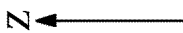

With reference to FIG. 7, a bit-line-contact-etching process may be performed using the second mask layer 813 as a mask to remove portions of the bottom dielectric layer 111 and portions of the impurity region 105, and concurrently form a bit-line-contact opening 301O. The bit-line-contact opening 301O may be formed extending to the impurity region 105 and may be between the word line structures 200 formed in the trenches TR2. After formation of the bit-line-contact opening 301O, the second mask layer 813 may be removed.

Figure 8:
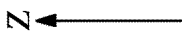

With reference to FIG. 8, the bit-line contact 301 may be formed in the bit-line-contact opening 301O which is achieved by depositing a conductive material and subsequently undergoing a planarization process, such as chemical mechanical polishing. In some embodiments, the conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The bit-line contact 301 may be electrically connected to the impurity region 105.

Figure 9:
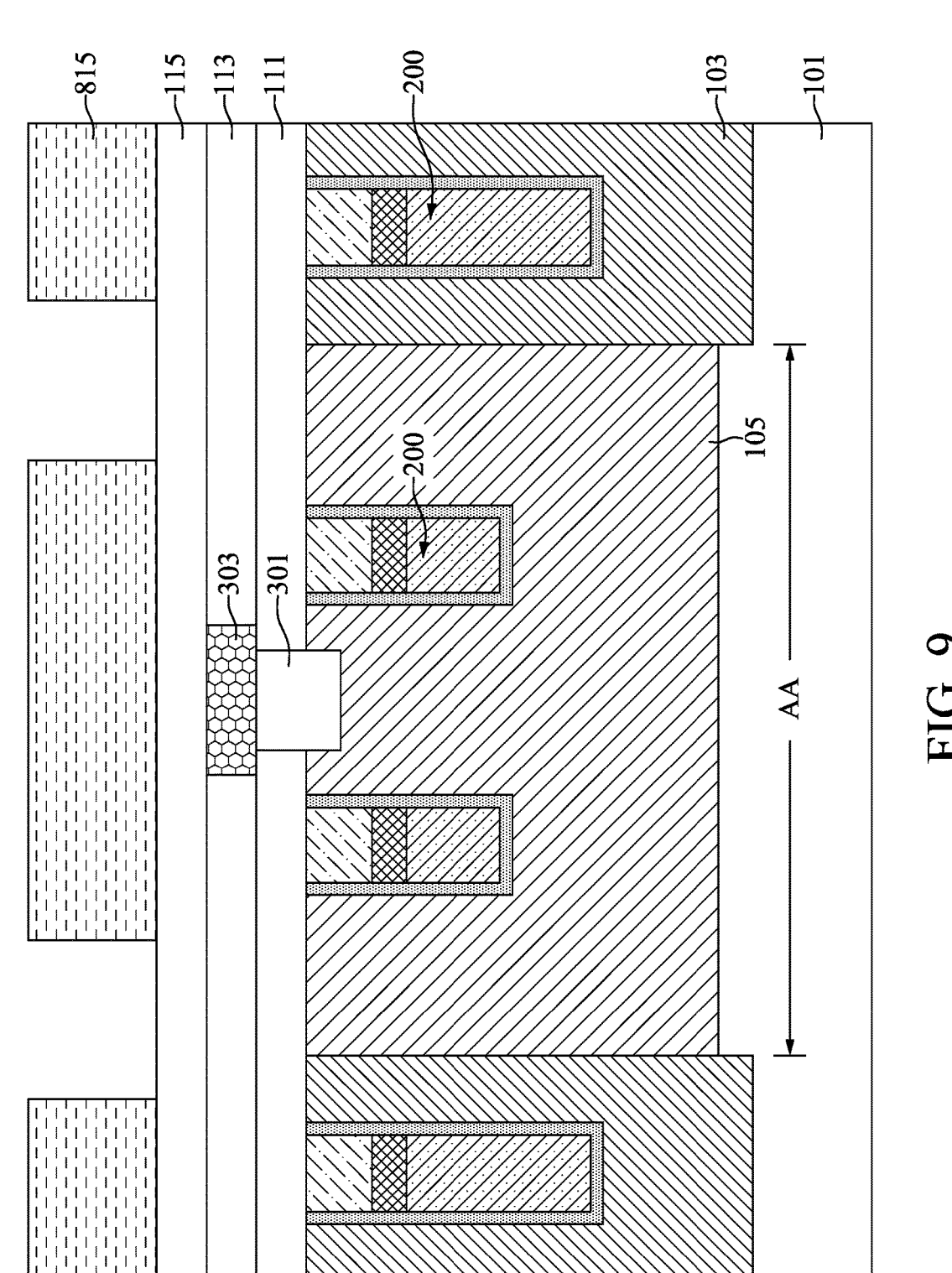

With reference to FIG. 9, the middle dielectric layer 113 may be formed on the bottom dielectric layer 111. In some embodiments, the middle dielectric layer 113 may be formed of the same material as the bottom dielectric layer 111 but is not limited thereto. In some embodiments, the bit line 303 may be formed in the middle dielectric layer 113 and may be formed on the bit-line contact 301. The bit line 303 may be electrically coupled to the impurity region 105 through the bit-line contact 301. In some embodiments, the bit line 303 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIG. 9, the top dielectric layer 115 may be formed on the middle dielectric layer 113. In some embodiments, the top dielectric layer 115 may be formed of the same material as the bottom dielectric layer 111 but is not limited thereto. A third mask layer 815 may be formed on the top dielectric layer 115. In some embodiments, the third mask layer 815 may be a photoresist layer and may include the pattern of the plurality of cell-contact openings 401O.

Figure 10:
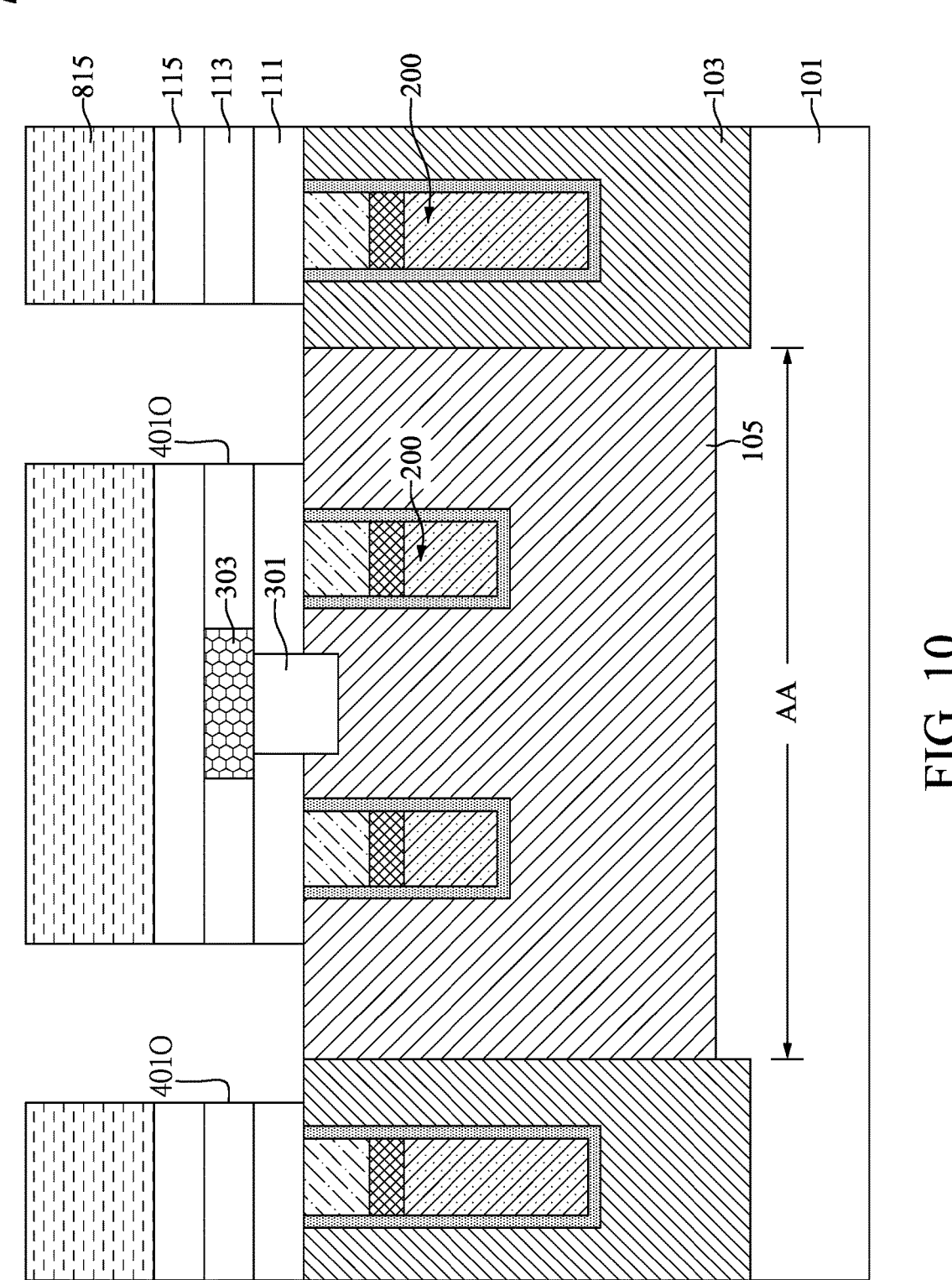

With reference to FIG. 10, a cell-contact-etching process may be performed using the third mask layer 815 as a mask to remove portions of the top dielectric layer 115, the middle dielectric layer 113, and the bottom dielectric layer 111. After the cell-contact-etching process, the plurality of cell-contact openings 401O may be formed through the top dielectric layer 115, the middle dielectric layer 113, and the bottom dielectric layer 111.

For brevity, clarity, and convenience of description, only one cell-contact opening 401O is described.

With reference to FIGS. 11 and 12, the third mask layer 815 may be removed by an ashing process or other applicable semiconductor processes. A portion of the impurity region 105 and a portion of the isolation layer 103 may be exposed through the cell-contact opening 401O. In some embodiments, in a top-view perspective, the cell-contact opening 401O may include a square cross-sectional profile. In some embodiments, the cell-contact opening 401O may include a rectangular cross-sectional profile (not shown).

Figure 13:
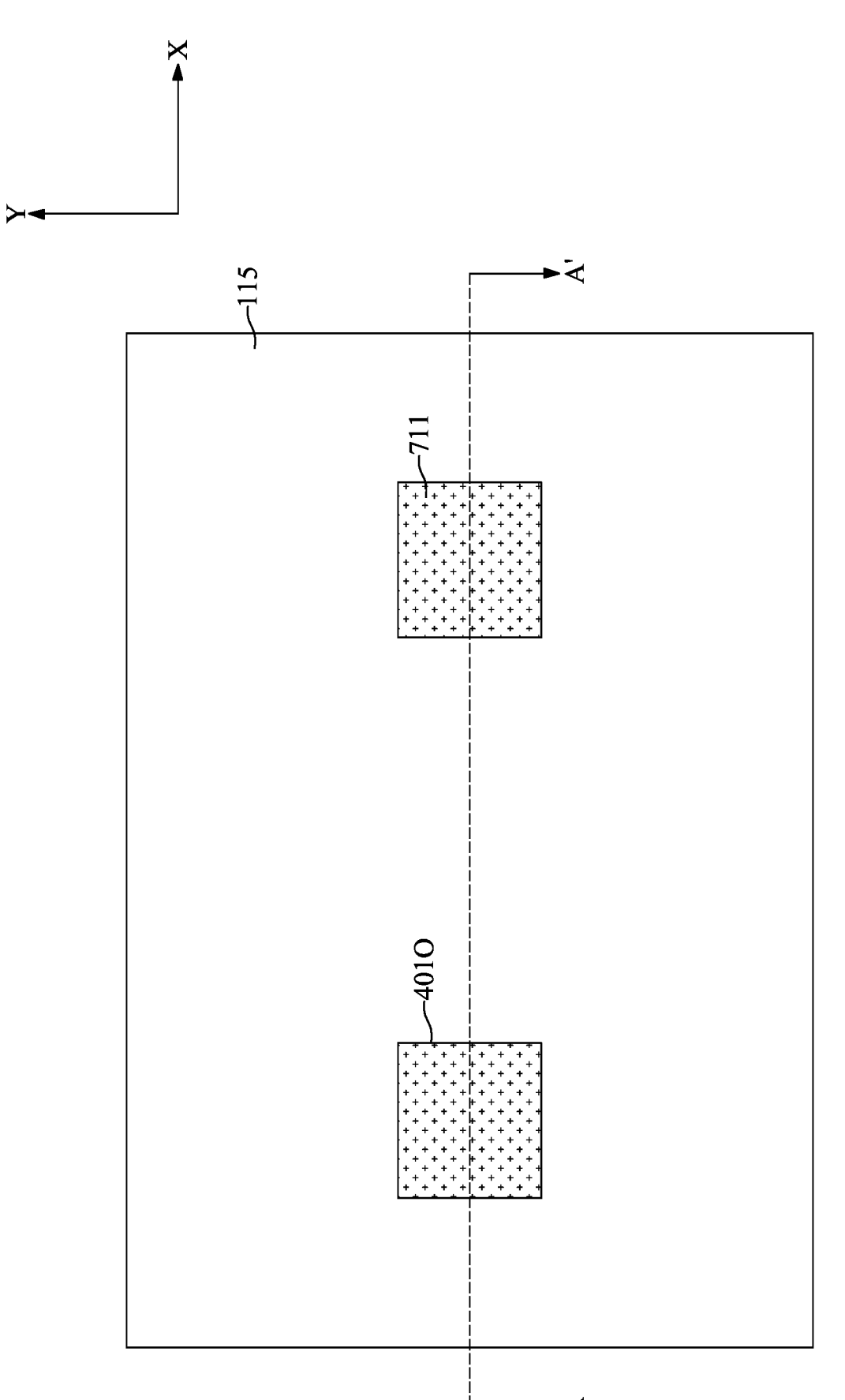
FIG. 13 illustrates, in a schematic top-view diagram, an intermediate semiconductor device in accordance with one embodiment of the present disclosure.
Figure 14:
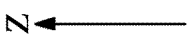
FIG. 14 is a schematic cross-sectional view diagram taken along a line A-A' in FIG. 13.
Figure 15:
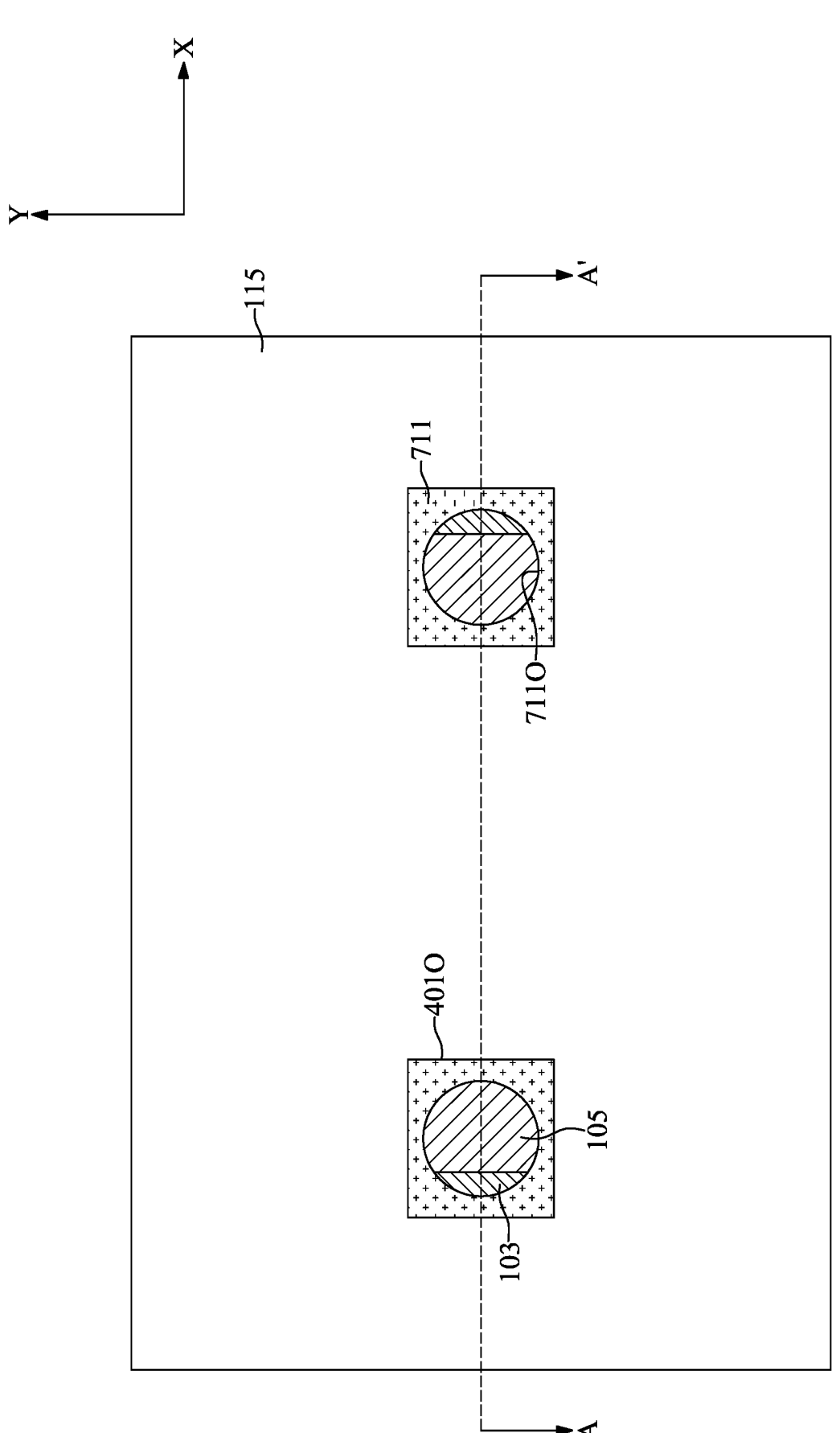
FIG. 15 illustrates, in a schematic top-view diagram, an intermediate semiconductor device in accordance with one embodiment of the present disclosure.
Figure 16:
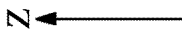
FIGS. 16 and 17 are schematic cross-sectional view diagrams taken along a line A-A' in FIG. 15 illustrating part of the flow for fabricating the semiconductor device in accordance with one embodiment of the present disclosure.
Figure 17:
Figure 18:
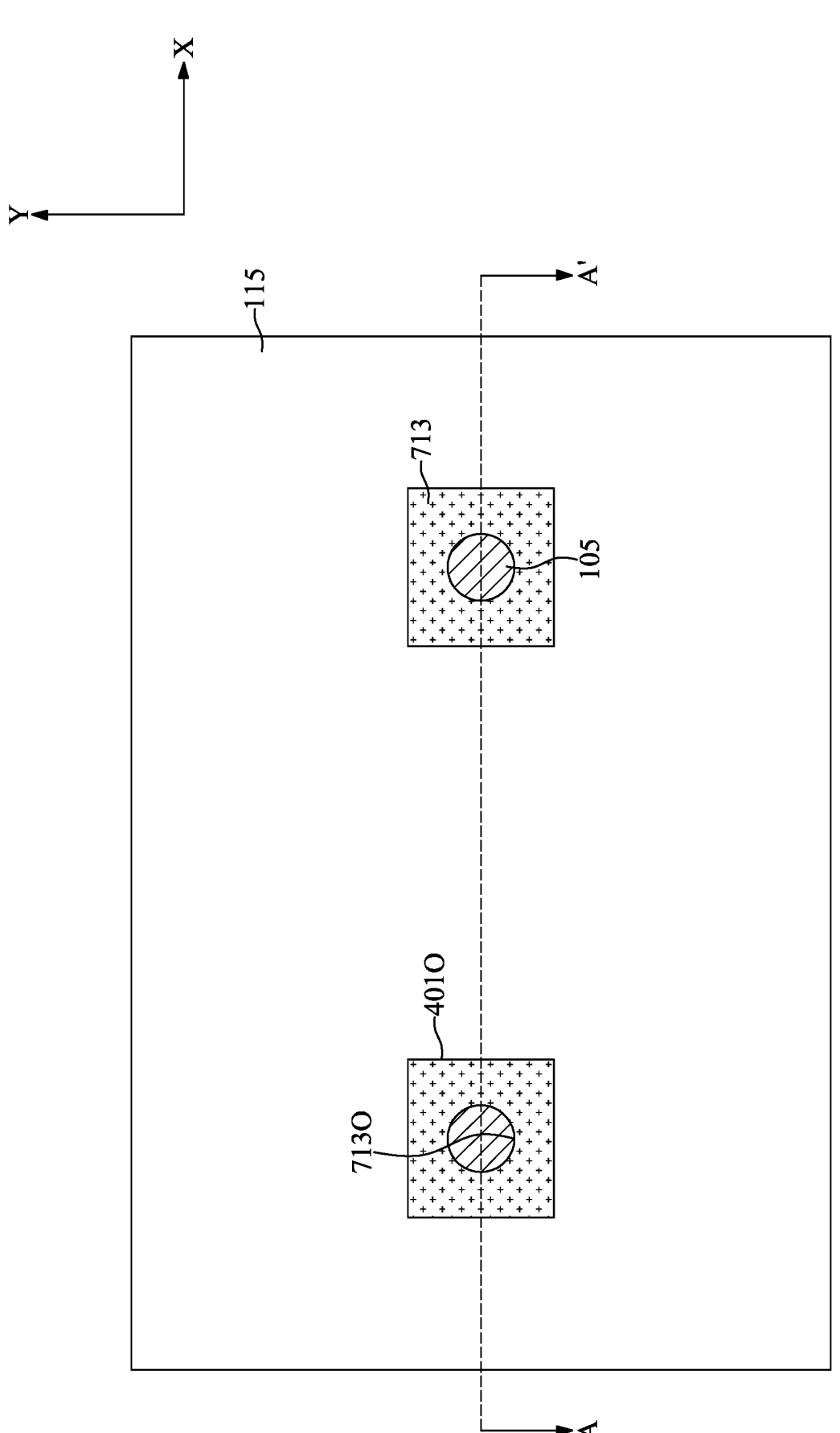
FIG. 18 illustrates, in a schematic top-view diagram, an intermediate semiconductor device in accordance with one embodiment of the present disclosure.
Figure 19:
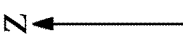
FIG. 19 is a schematic cross-sectional view diagram taken along a line A-A' in FIG. 18.

FIG. 13 illustrates, in a schematic top-view diagram, an intermediate semiconductor device in accordance with one embodiment of the present disclosure. FIG. 14 is a schematic cross-sectional view diagram taken along a line A-A' in FIG. 13. FIG. 15 illustrates, in a schematic top-view diagram, an intermediate semiconductor device in accordance with one embodiment of the present disclosure. FIGS. 16 and 17 are schematic cross-sectional view diagrams taken along a line A-A' in FIG. 15 illustrating part of the flow for fabricating the semiconductor device 1A in accordance with one embodiment of the present disclosure. FIG. 18 illustrates, in a schematic top-view diagram, an intermediate semiconductor device in accordance with one embodiment of the present disclosure. FIG. 19 is a schematic cross-sectional view diagram taken along a line A-A' in FIG. 18.

With reference to FIG. 1 and FIGS. 13 to 19, at step S13, a first sacrificial layer 711 and a second sacrificial layer 713 may be sequentially formed to partially fill the plurality of cell-contact openings 401O, forming a plurality of first intermediate openings 711O and a plurality of second intermediate openings 713O which expose the impurity region 105.

An opening-tuning process may be performed to adjust the exposed portion within the cell-contact opening 401O. In some embodiments, the opening-tuning process may include one deposition act followed by one etching act. A deposition act and the followed etching act may be referred to as a cycle. Multiple cycles may be performed during the opening-tuning process. During the deposition act, a sacrificial material may be filled completely into the cell-contact opening 401O. The subsequent etching act may remove part of the sacrificial material, leaving an intermediate opening inside the cell-contact opening 401O. This may effectively reduce the size of the exposed portion within the cell-contact opening 401O, resulting in it being only partially filled. For a visual representation of this process, refer to FIGS. 13 to 19, which illustrate an exemplary opening-tuning process including two cycles.

With reference to FIGS. 13 and 14, during the deposition act of the first cycle of the opening-tuning process, the first sacrificial layer 711 may be deposited to completely fill the cell-contact opening 401O. The first sacrificial layer 711 may be formed of the sacrificial material. In some embodiments, the first sacrificial layer 711 may be formed by, for example, chemical vapor deposition, plasma-enhanced chemical vapor deposition, or other applicable deposition processes. A planarization process may be performed until the top surface of the top dielectric layer 115 is exposed to provide a substantially flat surface for the subsequent semiconductor process. In some embodiments, the planarization process may be optional.

In some embodiments, the sacrificial material may be a material having etching selectivity to the top dielectric layer 115 and the impurity region 105 (or the substrate 101). In some embodiments, the sacrificial material may be formed of, for example, silicon nitride, boron nitride, silicon boron nitride, phosphorus boron nitride, boron carbon silicon nitride, or a combination thereof. In some embodiments, the sacrificial material may be formed of, for example, boron nitride, silicon boron nitride, phosphorus boron nitride, boron carbon silicon nitride, or a combination thereof.

With reference to FIGS. 15 and 16, during the etching act of the first cycle of the opening-tuning process, an etching process may be performed to remove a portion of the first sacrificial layer 711 resulting in the first intermediate opening 711O. The residual first sacrificial layer 711 may primarily adhere to the sidewall of the cell-contact opening 401O. In the current stage, the exposed portion within the cell-contact opening 401O may still include the isolation layer 103 and the impurity region 105. In some embodiments, the first intermediate opening 711O may have a circle cross-sectional profile in a top-view perspective but is not limited thereto. In some embodiments, the first intermediate opening 711O may have a diameter (or dimension) D1.

With reference to FIG. 17, during the deposition act of the second cycle of the opening-tuning process, additional sacrificial material may be conformally deposited over the top dielectric layer 115 to transform the first sacrificial layer 711 into the second sacrificial layer 713. In the current stage, the base of the first intermediate opening 711O may be filled, leaving no exposed portion within the cell-contact opening 401O.

With reference to FIGS. 18 and 19, during the etching act of the second cycle of the opening-tuning process, an etching process may be performed to remove a portion of the second sacrificial layer 713 resulting in the second intermediate opening 713O. The residual second sacrificial layer 713 may primarily adhere to the sidewall of the cell-contact opening 401O. The residual second sacrificial layer 713 may be thicker than the residual first sacrificial layer 711. In the current stage, the exposed portion within the cell-contact opening 401O may only include the impurity region 105. In some embodiments, the second intermediate opening 713O may have a circle cross-sectional profile in a top-view perspective but is not limited thereto. In some embodiments, the second intermediate opening 713O may have a diameter (or dimension) D2. The diameter D2 of the second intermediate opening 713O may be less than the diameter D1 of the first intermediate opening 711O.

Alternatively, in some embodiments, the exposed portion within the cell-contact opening 401O may also include the impurity region 105 and the isolation layer 103 after the formation of the second intermediate opening 713O (not shown). However, the area of the exposed portion within the cell-contact opening 401O after the formation of the second intermediate opening 713O may be less than the area of the exposed portion within the cell-contact opening 401O after the formation of the first intermediate opening 711O.

In some embodiments, a planarization process, such as chemical mechanical polishing, may be performed until the top surface of the top dielectric layer 115 is exposed to remove excess material and provide a substantially flat surface for subsequent processing steps. In some embodiments, the planarization process may be optional.

In some embodiments, more cycles of the opening-tuning process may be performed until the required diameter (or dimension) of the intermediate opening is achieved. In some embodiments, only one cycle of the opening-tuning process may be performed to achieve the required diameter of the intermediate opening.

Figure 20:
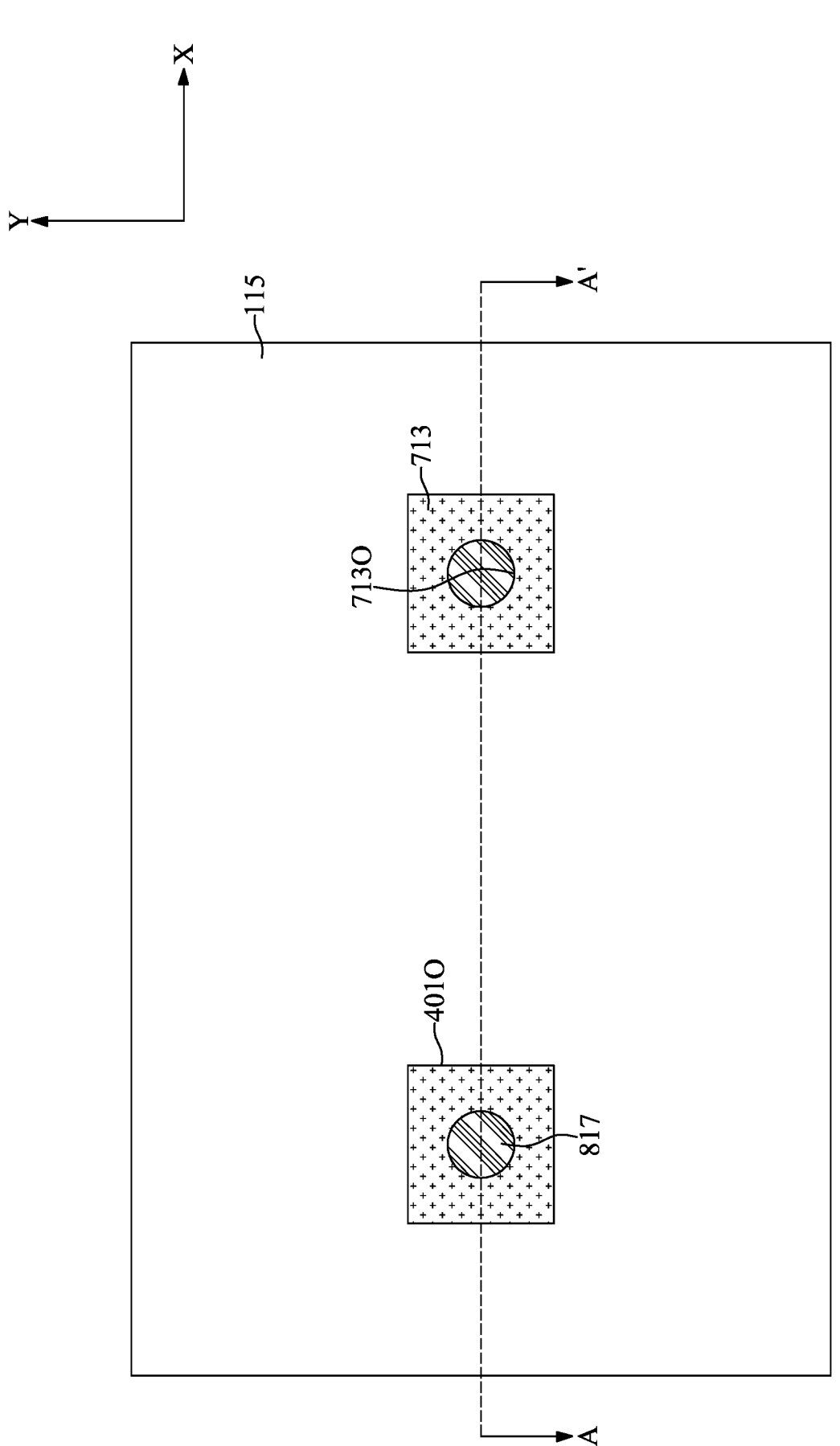
FIG. 20 illustrates, in a schematic top-view diagram, an intermediate semiconductor device in accordance with one embodiment of the present disclosure.
Figure 21:
FIG. 21 is a schematic cross-sectional view diagram taken along a line A-A' in FIG. 20.

FIG. 20 illustrates, in a schematic top-view diagram, an intermediate semiconductor device in accordance with one embodiment of the present disclosure. FIG. 21 is a schematic cross-sectional view diagram taken along a line A-A' in FIG. 20. FIG. 22 illustrates, in a schematic top-view diagram, an intermediate semiconductor device in accordance with one embodiment of the present disclosure. FIGS. 23 to 26 are schematic cross-sectional view diagrams taken along a line A-A' in FIG. 22 illustrating part of the flow for fabricating the semiconductor device 1A in accordance with one embodiment of the present disclosure. FIG. 27 is a schematic cross-sectional view diagram taken along lines A-A' and B-B' in FIG. 26.

With reference to FIG. 1 and FIGS. 20 to 27, at step S15, a plurality of blocking layers 817 may be formed in the plurality of the second intermediate openings 713O, the second sacrificial layer 713 may be removed, the plurality of cell-contact openings 401O may be deepened to form a plurality of extended cell-contact openings 403E, the plurality of blocking layers 817 may be removed, and a plurality of contact structures 400 may be formed in the plurality of extended cell-contact openings 403E.

For brevity, clarity, and convenience of description, only one blocking layer 817 is described.

With reference to FIGS. 20 and 21, the blocking layer 817 may completely fill the second intermediate opening 713O. In some embodiments, the top surfaces of the blocking layer 817, the second sacrificial layer 713, and the top dielectric layer 115 may be substantially coplanar. In some embodiments, the blocking layer 817 may be formed of a material having etching selectivity to the second sacrificial layer 713 and the top dielectric layer 115. In some embodiments, the blocking layer 817 may be a photoresist layer.

Alternatively, in some embodiments, the top surface of the blocking layer 817 may be lower than the top surface of the second sacrificial layer 713 or the top surface of the top dielectric layer 115 (not shown).

Figure 23:
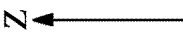

With reference to FIGS. 22 and 23, the second sacrificial layer 713 may be removed. In some embodiments, the removal of the second sacrificial layer 713 may be achieved by an etching process such as a wet etching process. In some embodiments, the etch rate ratio of the second sacrificial layer 713 to the blocking layer 817 may be between about 100:1 and about 2:1, between about 15:1 and about 2:1, or between about 10:1 and about 2:1 during the wet etching process. In some embodiments, the etch rate ratio of the second sacrificial layer 713 to the top dielectric layer 115 may be between about 100:1 and about 2:1, between about 15:1 and about 2:1, or between about 10:1 and about 2:1 during the wet etching process.

Figure 24:
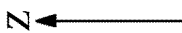

With reference to FIG. 24, the cell-contact opening 401O may be deepened towards the substrate 101 using an etching process, such as an anisotropic dry etching process. The anisotropic dry etching process may employ the blocking layer 817 as a mask. After the anisotropic etching process, the cell-contact opening 401O may expand to form the extended cell-contact opening 403E. The lower section of the extended cell-contact opening 403E may encompass a protruding portion 101P of the impurity region 105, which is shielded by the blocking layer 817.

Figure 25:
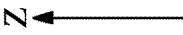

With reference to FIG. 25, the blocking layer 817 may be removed by, for example, an ashing process or an etching process. In some embodiments, the top surface 101PT of the protruding portion 101P and the top surface 101TS of the substrate 101 may be substantially coplanar. In some embodiments, the top surface 101PT of the protruding portion 101P may be slightly lower than the top surface 101PT of the substrate 101 due to the consumption of the protruding portion 101P during the removal of the blocking layer 817 (not shown).

With reference to FIGS. 26 and 27, a conductive material may be deposited to completely fill the extended cell-contact opening 403E. A planarization process, such as chemical mechanical polishing, may be performed until the top surface of the top dielectric layer 115 is exposed to remove excess material, provide a substantially flat surface for subsequent processing steps, and concurrently form the plurality of contact structures 400. In some embodiments, the conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

For brevity, clarity, and convenience of description, only one contact structure 400 is described.

In some embodiments, the contact structure 400 may include a body portion 401 and an extending portion 403. The extending portion 403 may be disposed in the lower section of the extended cell-contact opening 403E and encompassing the protruding portion 101P of the impurity region 105. In some embodiments, the top surface 403TS of the extending portion 403, the top surface 101PT of the protruding portion 101P and the top surface 101TS of the substrate 101 may be substantially coplanar. In some embodiments, the bottom surface 403BS of the extending portion 403 may be substantially flat. In some embodiments, the extending portion 403 may have a square-ring-shaped cross-sectional profile in a top-view perspective.

The body portion 401 may be formed on the extending portion 403 and the protruding portion 101P. In some embodiments, the body portion 401 may have a square cross-sectional profile in a top-view perspective. In some embodiments, the body portion 401 may have a rectangular cross-sectional profile in a top-view perspective (not shown). In some embodiments, a height ratio of a height H1 of the extending portion 403 to a height H2 of the contact structure 400 may be between about 0.05 and about 0.30, between about 0.10 and about 0.30, or between about 0.15 and about 0.20.

State differently, the extending portion 403 may extend from the body portion 401 towards the substrate 101. A groove 403R may be recessed from the bottom surface 403BS of the extending portion 403 and leading towards the body portion 401. The groove 403R may accommodate the protruding portion 101P, which directly contacts the body portion 401. In some embodiments, the center point CP1 (shown as a cross mark) of the body portion 401 may align with the center point CP2 (shown as a cross mark) of the groove (or referred to as the center point CP2 of the protruding portion 101P) in a top-view perspective.

In the description of the present disclosure, an x-y-z coordinate system is assumed where x and y refer to dimensions within the plane parallel to the major surface of the structure and z refers a dimension perpendicular to the plane, one feature is aligned with another feature when those features have substantially the same x, y coordinates.

The contact area of the contact structure 400 may be increased by employing the extending portion 403. As a result, the performance of the semiconductor device 1A may be improved.

FIG. 28 illustrates, in schematic cross-sectional view diagrams, a body portion 401 and an extending portion 403 of a semiconductor device 1B in accordance with another embodiment of the present disclosure.

With reference to FIG. 28, the semiconductor device 1B may have a structure similar to that illustrated in FIG. 27. The same or similar elements in FIG. 28 as in FIG. 27 have been marked with similar reference numbers and duplicative descriptions have been omitted.

In the semiconductor device 1B, the body portion 401 may have a circle cross-sectional profile in a top-view perspective. The extending portion 403 may have a ring-shaped cross-sectional profile in a top-view perspective.

FIG. 29 illustrates, in schematic cross-sectional view diagrams, a body portion 401 and an extending portion 403 of a semiconductor device 1C in accordance with another embodiment of the present disclosure.

With reference to FIG. 29, the semiconductor device 1C may have a structure similar to that illustrated in FIG. 27. The same or similar elements in FIG. 29 as in FIG. 27 have been marked with similar reference numbers and duplicative descriptions have been omitted.

In the semiconductor device 1C, the center point CP1 of the body portion 401 may not align with the center point CP2 of the groove (or the center point CP2 of the protruding portion 101P) in a top-view perspective.

FIG. 30 illustrates, in a schematic cross-sectional view diagram, a semiconductor device 1D in accordance with another embodiment of the present disclosure.

With reference to FIG. 30, the semiconductor device 1D may have a structure similar to that illustrated in FIG. 27. The same or similar elements in FIG. 30 as in FIG. 27 have been marked with similar reference numbers and duplicative descriptions have been omitted.

In the semiconductor device 1D, the bottom surface 403BS of the extending portion 403 may be inclined with respect to the top surface 101TS of the substrate 101. In some embodiments, the bottom surface 403BS near the word line structure 200 disposed in the trench TR2 may be higher than the bottom surface 403BS near the word line structure 200 disposed in the trench TR1.

One aspect of the present disclosure provides a contact structure including a body portion; and an extending portion downwardly extending from the body portion and comprising a groove. The groove is recessed from a bottom surface of the extending portion, leading towards the body portion, and exposing the body portion.

Another aspect of the present disclosure provides a semiconductor device including a substrate; an impurity region positioned in the substrate; and a contact structure comprising a body portion positioned on the substrate, and an extending portion downwardly extending from the body portion towards the substrate and resulting in a groove. The groove accommodates a protruding portion of the impurity region, which directly contacts the body portion.

Another aspect of the present disclosure provides a method for fabricating a semiconductor device including providing a substrate; forming a dielectric layer on the substrate; forming a cell-contact opening along the dielectric layer to expose the substrate; conformally forming a sacrificial layer that partially fills the cell-contact opening, resulting in an intermediate opening that exposes the substrate; forming a blocking layer completely filling the intermediate opening; removing the sacrificial layer; performing an etching process using the blocking layer as a mask to deepen the cell-contact opening into the substrate and turn the cell-contact opening into an extended cell-contact opening, which surrounds a protruding portion of the substrate; removing the blocking layer; and forming a contact structure in the extended cell-contact opening.

Due to the design of the semiconductor device of the present disclosure, the extending portion 403 may increase the contact area between the contact structure 400 and the impurity region 105. As a result, the performance of the semiconductor device 1A may be improved.

Substitutions present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate;
   forming a dielectric layer on the substrate;
   forming a cell-contact opening along the dielectric layer to expose the substrate;

conformally forming a sacrificial layer that partially fills the cell-contact opening, resulting in an intermediate opening that exposes the substrate;
   forming a blocking layer completely filling the intermediate opening;
   removing the sacrificial layer;
   performing an etching process using the blocking layer as a mask to deepen the cell-contact opening into the substrate and turn the cell-contact opening into an extended cell-contact opening, which surrounds a protruding portion of the substrate;
   removing the blocking layer; and
   forming a contact structure in the extended cell-contact opening.

2. The method for fabricating the semiconductor device of claim 1, wherein the sacrificial layer comprises silicon nitride, boron nitride, silicon boron nitride, phosphorus boron nitride, boron carbon silicon nitride, or a combination thereof.

3. The method for fabricating the semiconductor device of claim 1, wherein the blocking layer comprises photoresist.

4. The method for fabricating the semiconductor device of claim 3, wherein the blocking layer is removed by ashing.

5. The method for fabricating the semiconductor device of claim 1, wherein the contact structure comprises tungsten, cobalt, zirconium, tantalum, titanium, aluminum, ruthenium, copper, metal carbides, metal nitrides, transition metal aluminides, or a combination thereof.

6. The method for fabricating the semiconductor device of claim 1, wherein the contact structure comprises an extending portion and a body portion, the extending portion surrounds the protruding portion of the substrate, and the body portion formed on the extending portion.

7. The method for fabricating the semiconductor device of claim 6, wherein the body portion has a square cross-sectional profile in a top-view perspective.

8. The method for fabricating the semiconductor device of claim 7, wherein the extending portion has a square-ring-shaped cross-sectional profile in a top-view perspective.

9. The method for fabricating the semiconductor device of claim 6, wherein the body portion has a circle cross-sectional profile in a top-view perspective.

10. The method for fabricating the semiconductor device of claim 9, wherein extending portion has a ring-shaped cross-sectional profile in a top-view perspective.

* * * * *